(12) United States Patent
Doan

(10) Patent No.: US 6,440,613 B1
(45) Date of Patent: Aug. 27, 2002

(54) METHOD OF FABRICATING ATTENUATED PHASE SHIFT MASK

(75) Inventor: Trung Tri Doan, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/389,870

(22) Filed: Sep. 2, 1999

(51) Int. Cl.⁷ .................................................. G03F 9/00
(52) U.S. Cl. ........................... 430/5; 430/322; 430/323; 430/324
(58) Field of Search ........................... 430/5, 323, 324, 430/322

(56) References Cited

U.S. PATENT DOCUMENTS

| | | | |
|---|---|---|---|
| 5,194,344 A | 3/1993 | Cathey, Jr. et al. | 430/5 |
| 5,194,345 A | 3/1993 | Rolfson et al. | 430/5 |
| 5,194,346 A | 3/1993 | Rolfson et al. | 430/5 |
| 5,225,035 A | 7/1993 | Rolfson | 156/643 |
| 5,240,796 A | 8/1993 | Lee et al. | 430/5 |
| 5,281,500 A | 1/1994 | Cathey et al. | 430/5 |
| 5,376,483 A | 12/1994 | Rolfson | 430/5 |
| 5,468,578 A | 11/1995 | Rolfson | 430/5 |
| 5,495,959 A | 3/1996 | Rolfson | 216/12 |
| 5,536,606 A | 7/1996 | Doan | 430/5 |
| 5,576,126 A | 11/1996 | Rolfson | 430/5 |
| 5,635,315 A | 6/1997 | Mitsui | 430/5 |
| 5,667,918 A | 9/1997 | Brainerd et al. | 430/5 |
| 5,667,919 A | 9/1997 | Tu et al. | 430/5 |
| 5,672,450 A | 9/1997 | Rolfson | 430/5 |
| 5,700,602 A | 12/1997 | Dao et al. | 430/5 |
| 5,766,805 A | 6/1998 | Lee et al. | 430/5 |
| 5,766,829 A | 6/1998 | Cathey, Jr. et al. | 430/394 |
| 5,882,827 A | 3/1999 | Nakao | 430/5 |
| 5,888,674 A | 3/1999 | Yang et al. | 430/5 |
| 5,935,736 A * | 8/1999 | Tzu | 430/5 |

* cited by examiner

Primary Examiner—Mark F. Huff
Assistant Examiner—Saleha R. Mohamedulla
(74) Attorney, Agent, or Firm—Wells St. John P.S.

(57) ABSTRACT

The invention comprises methods of fabricating attenuated phase shift masks. In but one implementation, a method of fabricating an attenuated phase shift mask having a circuitry pattern area and a no-circuitry area includes providing a transparent substrate. A first light shielding layer is formed over the transparent substrate. The first light shielding layer comprises a semi-transparent shifter material. A second light shielding layer is formed over the first light shielding layer. At least some of the second light shielding layer material is removed from the circuitry pattern area prior to forming a circuitry pattern in a photoresist layer in the circuitry pattern area. In one implementation, the first light shielding layer is etched within the circuitry pattern area without using the second light shielding layer as a mask within the circuitry pattern area during the etching. In one implementation, the first light shielding layer is etched within the circuitry pattern area to define a desired circuitry pattern while a photoresist layer masks some of the first light shielding layer within the circuitry pattern area.

55 Claims, 6 Drawing Sheets

METHOD OF FABRICATING ATTENUATED PHASE SHIFT MASK

TECHNICAL FIELD

This invention relates to methods of fabricating attenuated phase shift masks.

BACKGROUND OF THE INVENTION

In semiconductor manufacturing, photolithography is typically used in the formation of integrated circuits on a semiconductor wafer. During a lithographic process, a form of radiant energy such as ultraviolet light is passed through a mask/reticle and onto the semiconductor wafer. The mask contains light restricting regions (for example totally opaque or attenuated/half-tone) and light transmissive regions (for example totally transparent) formed in a predetermined pattern. A grating pattern, for example, may be used to define parallel-spaced conductive lines on a semiconductor wafer. The wafer is provided with a layer of photosensitive resist material commonly referred to as photoresist. Ultraviolet light passed through the mask onto the layer of photoresist transfers the mask pattern therein. The resist is then developed to remove either the exposed portions of resist for a positive resist or the unexposed portions of the resist for a negative resist. The remaining patterned resist can then be used as a mask on the wafer during a subsequent semiconductor fabrication step, such as ion implantation or etching relative to layers on the wafer beneath the resist.

Advances in semiconductor integrated circuit performance have typically been accompanied by a simultaneous decrease in integrated circuit device dimensions and in the dimensions of conductor elements which connect those integrated circuit devices. The wavelength of coherent light employed in photolithographic processes by which integrated circuit devices and conductors are formed has typically desirably been smaller than the minimum dimensions within the reticle or mask through which those integrated circuit devices and elements are printed. At some point, the dimension of the smallest feature opening within the reticle approaches the wavelength of coherent light to be employed. Unfortunately, the resolution, exposure latitude and depth of focus in using such reticles and light decreases due to aberrational effects of coherent light passing through openings of width similar to the wavelength of the coherent light. Accordingly as semiconductor technology has advanced, there has traditionally been a corresponding is decrease in wavelength of light employed in printing the features of circuitry.

One approach for providing high resolution printed integrated circuit devices of dimensions similar to the wavelength of coherent light utilized employs phase shift masks or reticles. In comparison with conventional reticles, phase shift masks typically incorporate thicker or thinner transparent regions within the conventional chrome metal-on-glass reticle construction. These shifter regions are designed to produce a thickness related to the wavelength of coherent light passing through the phase shift mask. Specifically, coherent light rays passing through the transparent substrate and the shifter regions have different optical path lengths, and thus emerge from those surfaces with different phases. By providing transparent shifter regions to occupy alternating light transmitting regions of the patterned metal layer of a conventional phase shift mask of the Levenson type, adjacent bright areas are formed preferably 180° out-of-phase with one another. The interference effects of the coherent light rays of different phase provided by a phase shift mask form a higher resolution image when projected onto a semiconductor substrate, with accordingly a greater depth of focus and greater exposure latitude.

Another type of phase shift mask is referred to as an attenuated or half-tone phase shift mask. The attenuated phase shift mask has formed upon a transparent substrate a patterned semitransparent shifter layer. Such is typically formed of an oxidized metal layer which provides a 180° phase shift to the coherent light rays utilized with the mask, and produces a light transmissivity in a range of from 4% to 30%.

Figure 1:
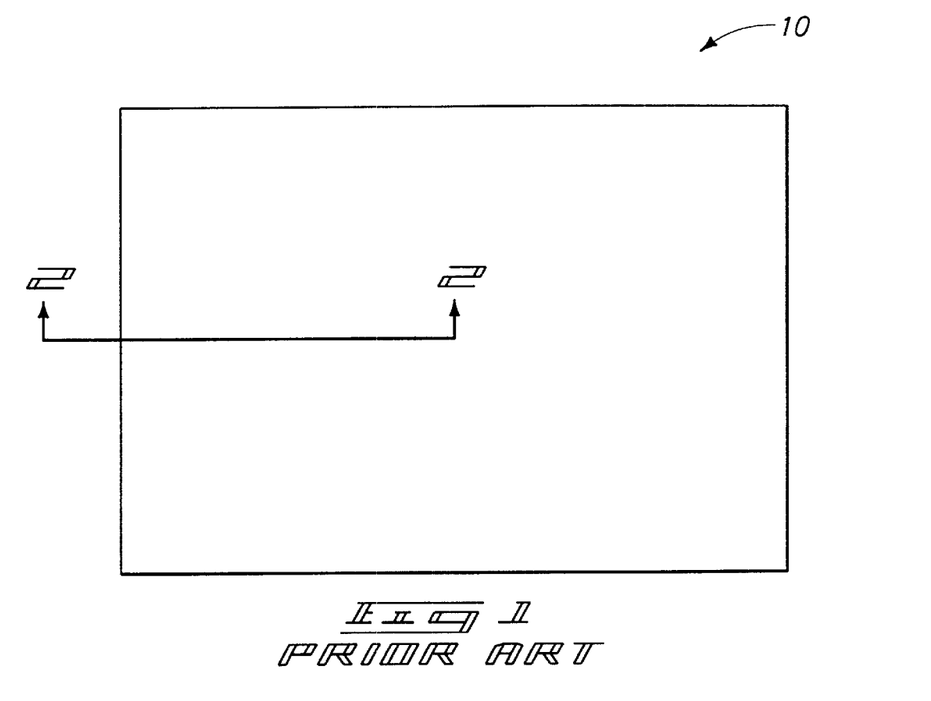
FIG. 1 is a top plan view of an attenuated phase shift mask substrate in process in accordance with the prior art.
Figure 2:
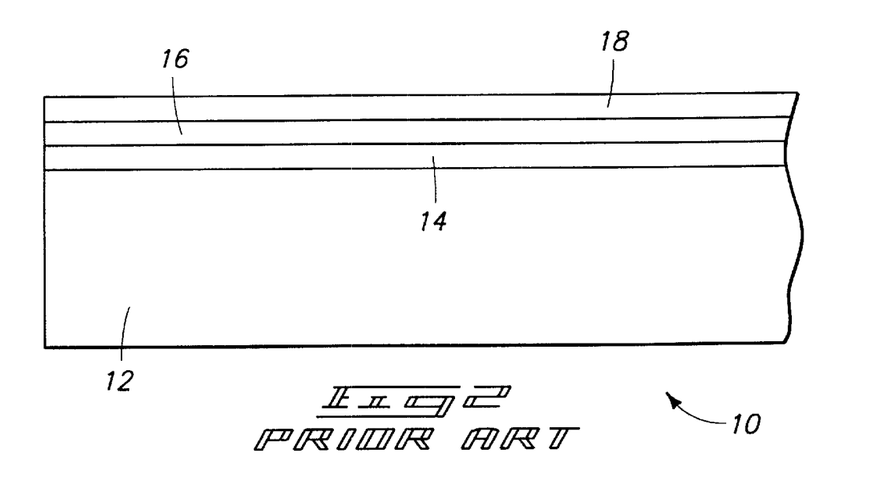
FIG. 2 is a diagrammatic sectional view of a portion of the FIG. 1 substrate.

A conventional typical prior art fabrication process for forming an attenuated phase shift mask and problems associated therewith are described with reference to FIGS. 1–8. FIGS. 1 and 2 depict a phase shift mask 10 comprising a transparent substrate 12, such as glass or other fused silica. A first light shielding layer 14 is formed over transparent substrate 12 and comprises a semi-transparent shifter material, such as $MoSi_xN_yO_z$. An example deposition thickness for layer 14 is 950 Angstroms. A second light shielding layer, typically opaque, is formed over and on first light shielding layer 16. An example thickness for layer 16 is 1000 Angstroms. Layer 16 might comprise one or more layers. For example, one common composition for layer 16 comprises an inner or base layer of $CrO_xN_y$ and an outer layer of $CrN_x$. Finally, a photoresist layer 18 is formed over and on layer 16.

Figure 3:
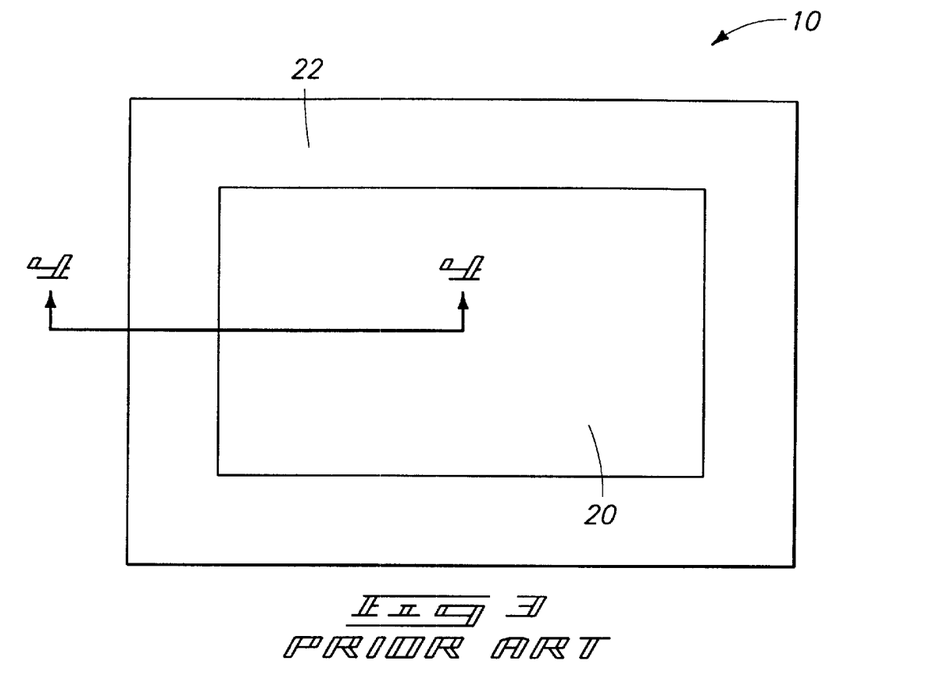
FIG. 3 is a top plan view of the FIG. 1 substrate at a prior art processing step subsequent to that depicted by FIG. 1.
Figure 4:
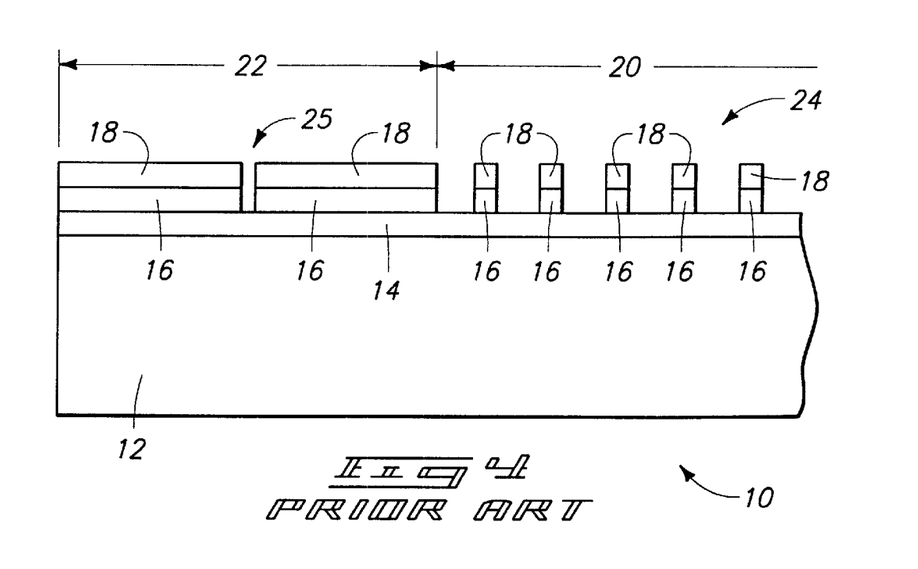
FIG. 4 is a diagrammatic sectional view taken through line 4—4 in FIG. 3.

Referring to FIGS. 3 and 4, photoresist layer 18 is patterned to form a circuitry pattern area 20 and a no-circuitry area 22 thereabout. Photoresist layer 18 is further patterned to define an exemplary desired circuit pattern 24 in the illustrated form of five conductive lines within area 20, and is also patterned to form an alignment marking 25 in no-circuitry frame area 22. Etching of layer 16 has been conducted largely selective relative to photoresist layer 18 and the $MoSi_xN_yO_z$ layer as shown. An example chemistry is a wet chemistry of ceric ammonium nitrate $[Ce(NH_4)_2(NO_3)_6]$, and an example dry chemistry (preferred) would be chlorine and oxygen based (i.e., $Cl_2$, $O_2$ and a carrier gas). Such chemistries can be used to etch both $CrO_xN_y$ and $CrN_x$ substantially selectively relative to both photoresist and $MoSi_xN_yO_z$.

Figure 5:
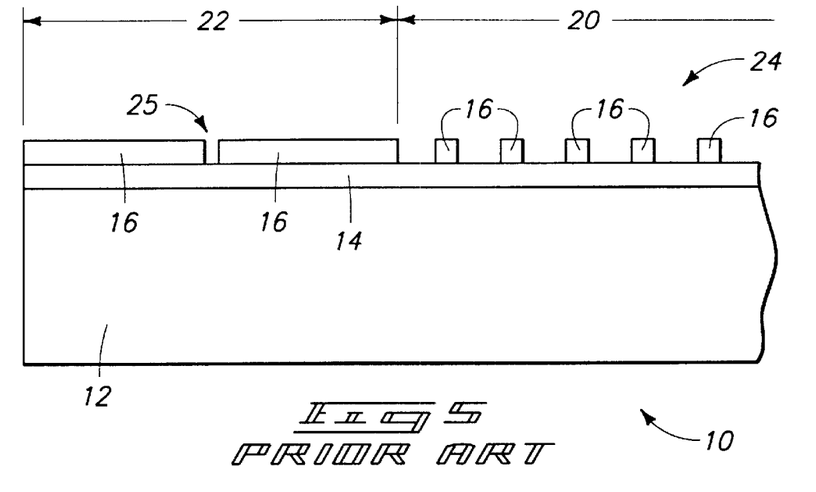
FIG. 5 is a view of the FIG. 4 substrate at a prior art processing step subsequent to that depicted by FIG. 4.

Referring to FIG. 5, photoresist layer 18 (not shown) has been stripped.

Figure 6:
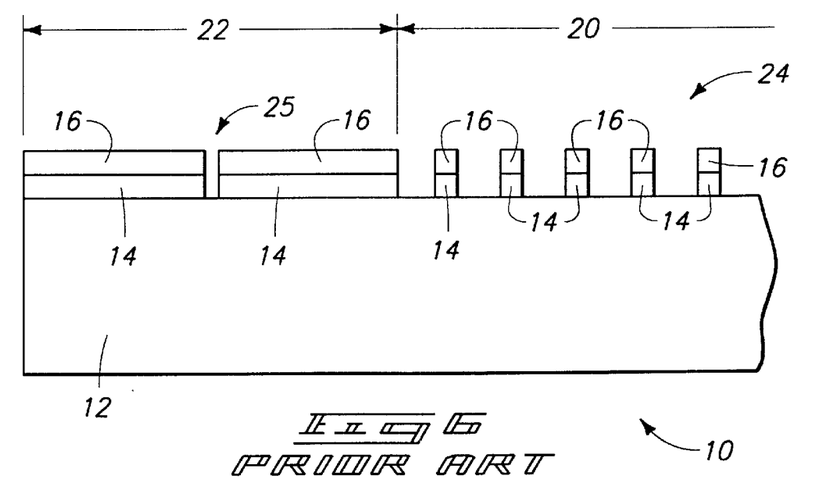
FIG. 6 is a view of the FIG. 5 substrate at a prior art processing step subsequent to that depicted by FIG. 5.

Referred to FIGS. 6, layer 16 is utilized as a hard mask and etching of $MoSi_xN_yO_z$ layer 14 is conducted substantially selective relative to layer 16. An example chemistry is a dry plasma chemistry using $SF_6$ and He. Thus, the mask pattern of photoresist layer 18 in FIG. 4 is transferred to the semitransparent shifter material 14.

Figure 7:
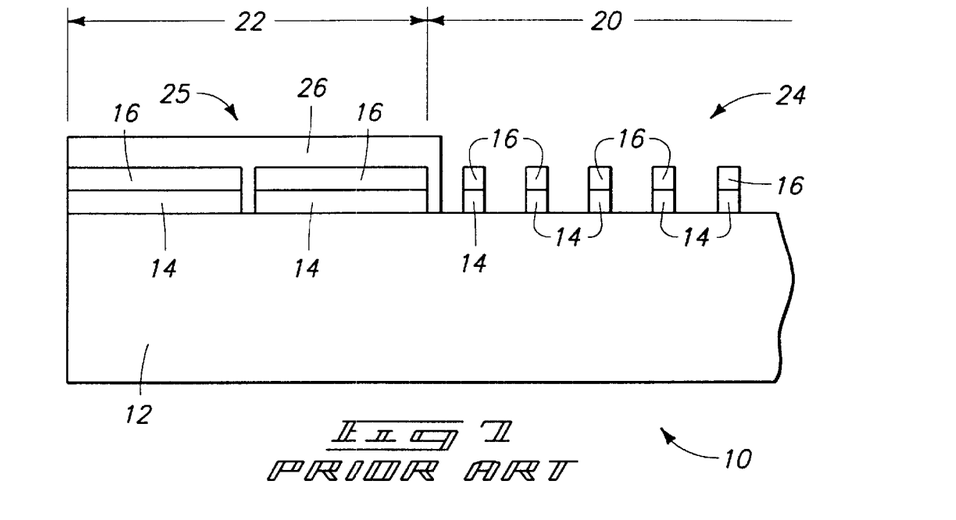
FIG. 7 is a view of the FIG. 6 substrate at a prior art processing step subsequent to that depicted by FIG. 6.

Referred to FIG. 7, a photoresist layer 26 is deposited and patterned to mask the entirety of frame region 22 while leaving the substantial portion of circuitry pattern area 20 outwardly exposed.

Figure 8:
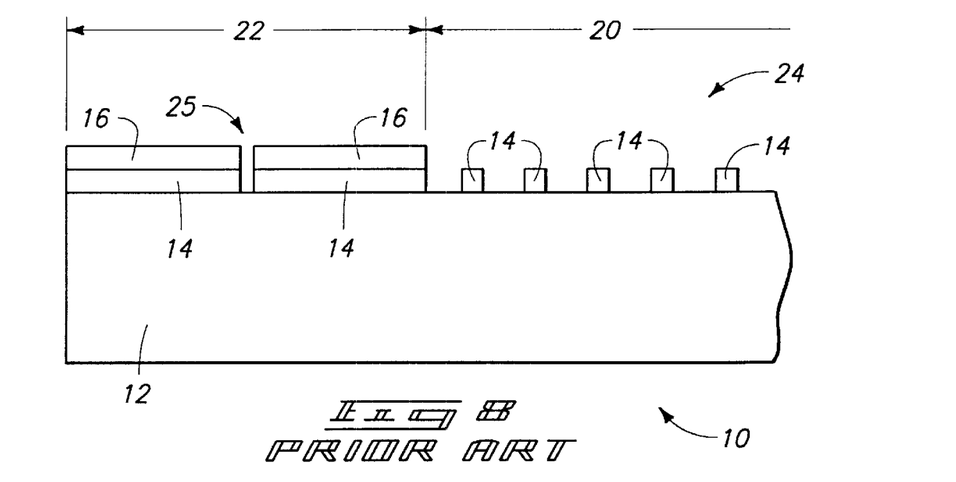
FIG. 8 is a view of the FIG. 7 substrate at a prior art processing step subsequent to that depicted by FIG. 7.

Referring to FIG. 8 and with photoresist layer 26 in place (not shown in FIG. 8), exposed material 16 within circuitry pattern area 20 is removed substantially selectively relative to the underlying $MoSi_xN_yO_z$ layer, for example utilizing the chemistry first described above.

One drawback with this particular processing is that the etch selectivity of removing the chromium material(s) of layer 16 relative to the $MoSi_xN_yO_z$ is not as selective as would be desired. This results in a reduced degree of anisotropy in the etch which increases the size of the openings between the circuitry elements, thereby undesirably increasing the critical dimension (CD) between components. Accordingly, it would be desirable to eliminate or substantially reduce this problem in the fabrication of an attenuated phase shift mask. While the invention was motivated by this objective, the invention is in no way so limited, with the invention being limited only by the accompanying claims appropriately interpreted in accordance with the Doctrine of Equivalents.

SUMMARY

The invention comprises methods of fabricating attenuated phase shift masks. In but one implementation, a method of fabricating an attenuated phase shift mask having a circuitry pattern area and a no-circuitry area includes providing a transparent substrate. A first light shielding layer is formed over the transparent substrate. The first light shielding layer comprises a semi-transparent shifter material. A second light shielding layer is formed over the first light shielding layer. At least some of the second light shielding layer material is removed from the circuitry pattern area prior to forming a circuitry pattern in a photoresist layer in the circuitry pattern area. In one implementation, the first light shielding layer is etched within the circuitry pattern area without using the second light shielding layer as a mask within the circuitry pattern area during the etching. In one implementation, the first light shielding layer is etched within the circuitry pattern area to define a desired circuitry pattern while a photoresist layer masks some of the first light shielding layer within the circuitry pattern area. Other implementations are contemplated.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 9:
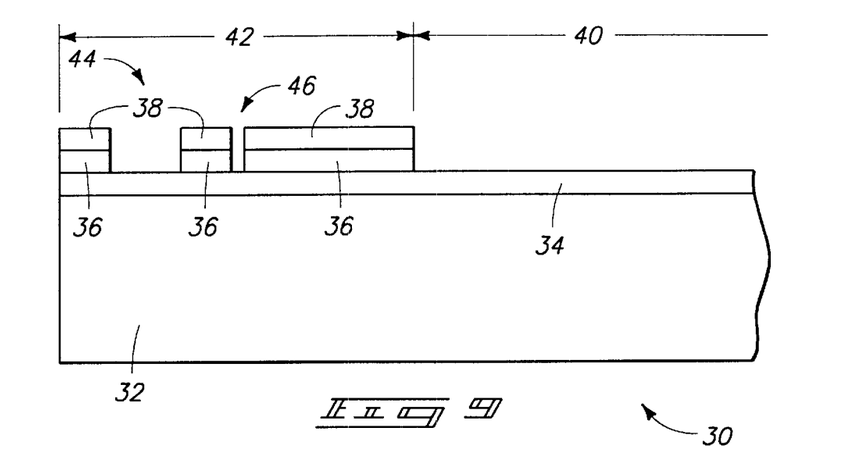
FIG. 9 is a diagrammatic sectional view of a attenuated phase shift mask substrate in process in accordance with an aspect of the invention.

Referring initially to FIG. 9, an attenuated phase shift mask substrate in process is indicated generally with reference numeral 30, and corresponds in processing in a preferred implementation to a processing step subsequent to that depicted by FIGS. 1 and 2 in the above-described prior art methodology. Phase shift mask substrate 30 comprises a transparent substrate 32, a first light shielding layer 34 formed thereover and thereon, and comprising a semi-transparent shifter BY material, and a second light shielding layer 36 formed over and on first light shielding layer 34. Preferred materials for layer 34 are metal silicon oxides, such as the $MoSi_xN_yO_z$ referred to above. Second light shielding layer 36 is substantially opaque to light transmission, although layer 36 might be fabricated to not be substantially opaque to light transmission yet still achieve an effective light masking. Preferred materials are one or more of the chromium materials referred to above (an inner or base layer of $CrO_xN_y$ and an outer layer of $CrN_x$). Thicknesses for layers 34 and 36 are preferably as described above.

A photoresist layer 38 has been formed over second light shielding layer and has been patterned to define a circuitry pattern area 40 and a no-circuitry pattern area 42. No-circuitry area 42 comprises a frame area which at least partially surrounds circuitry pattern area and preferably completely surrounds circuitry pattern area 40 like the depictions of regions 20 and 22 in FIG. 3. In an alternate considered embodiment, circuitry pattern area 40 can be considered as a circuitry array area comprising some degree of repetitive circuitry patterning, with frame area 42 optionally containing some circuitry or no circuitry. In the illustrated patterning, circuitry pattern area 40 is left completely or globally exposed while no-circuitry or frame area 42 is patterned to form alignment markings or regions 44 and 46. Other such markings would preferably, of course, be formed elsewhere within no-circuitry or frame area 42 over substrate 30, for example out of the plane illustrated with respect to the FIGS. 9–12 processing. Such provides but one example of patterning the no-circuitry or frame area differently from the circuitry pattern or circuitry array area. Further in accordance with a preferred aspect of the invention, no circuitry patterning has yet occurred in a photoresist layer within circuitry pattern area 40.

Still referring to FIG. 9, layer 36 is preferably substantially selectively etched relative to photoresist layer 38 and first light shielding layer 34, for example utilizing dry or wet etching chemistries as described above for the example chromium materials. Dry or wet etching describes or constitutes but example processes of removing second light shielding layer material. In accordance with one aspect of the invention, such provides but one example of removing at least some of second light shielding layer material 36, and preferably all as shown, from circuitry pattern area 40 prior to forming any circuitry pattern in photoresist layer in circuitry pattern area 40. Such removing preferably does not expose any transparent substrate material 32 within circuitry pattern area 40, although some such material could be exposed were some prior patterning conducted in this region.

Accordingly, such removing preferably exposes at least some first light shielding layer material 34 within circuitry pattern area 40. In the preferred embodiment where circuitry pattern area 40 is essentially entirely exposed, such etching provides an example of globally removing at least some second light shielding material 36, and preferably all of the second light shielding material 36, from circuitry pattern area 40 (as shown) prior to forming a circuitry pattern in either photoresist or first light shielding layer 34 in circuitry pattern area 40. Accordingly in the preferred embodiment where second light shielding layer material 36 is formed directly on first light shielding layer material 34, the removing exposes at least some, and in the illustrated and preferred example all, of the first light shielding layer material 34 within circuitry pattern area 40.

Figure 10:
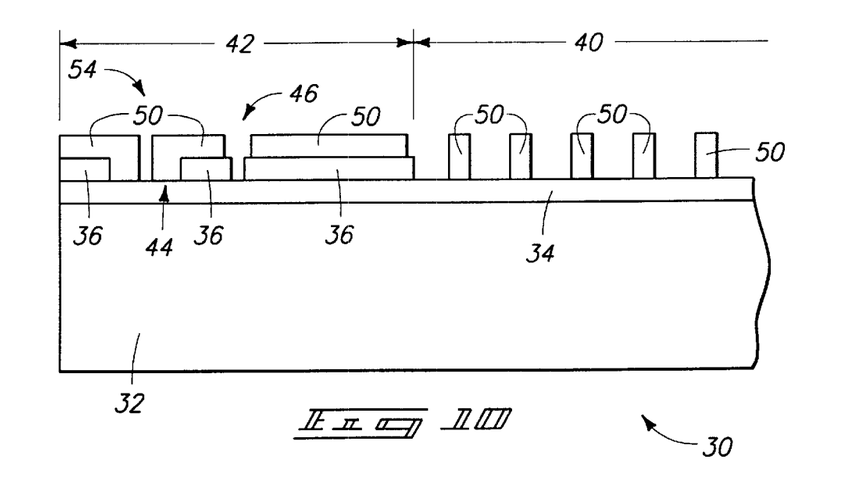
FIG. 10 is a view of the FIG. 9 substrate at a processing step subsequent to that depicted by FIG. 9.

Referred to FIG. 10, photoresist layer 38 (not shown) has been stripped and a subsequent photoresist layer 50 is deposited and patterned as shown. Such preferred patterning will form the desired circuit pattern within circuitry pattern area 40, again in this example in the form of the five illustrated line cross-sections. Photoresist layer 50 is also preferably patterned to completely outwardly expose initial alignment marking 46, and to form another desired alignment marking 54 which will be received entirely within the confines of initially formed alignment region 44. Such provides but one example of forming a desired mask in a photoresist layer 50 having a desired circuit pattern in circuitry pattern area 40, and a desired alignment marking pattern in no-circuitry or frame area 42 in the same step, and after patterning no-circuitry or frame area 42 differently from circuitry pattern area 40, as for example occurred with respect to the FIG. 9 illustrated processing.

Figure 11:
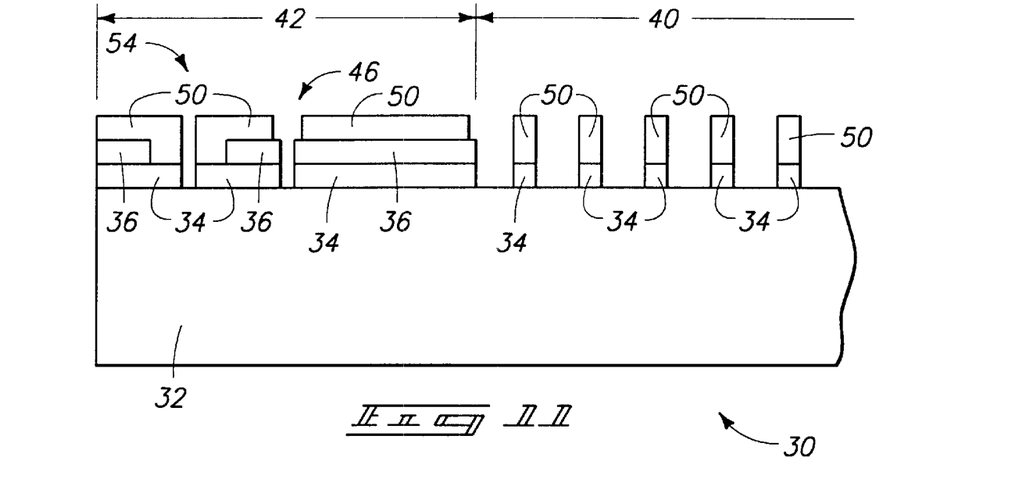
FIG. 11 is a view of the FIG. 9 substrate at a processing step subsequent to that depicted by FIG. 10.

Referring to FIG. 11, first light shielding layer 34 is etched substantially selectively relative to second light shielding layer 36 and is photoresist layer 50 to transfer the pattern of photoresist layer 50 to first light shielding layer 34. Accordingly, such provides but one example of etching light shielding layer material within circuitry pattern area 40 to define a desired circuitry pattern while a photoresist layer masks some of first light shielding layer 34 within circuitry pattern area 40. Such is, for example, contrary to the above-described prior art embodiment where no photoresist layer masks any of the first light shielding layer within the circuitry pattern area while etching to define a desired circuitry pattern in layer 34 within the circuitry pattern area. Also in the preferred illustrated FIG. 11 example, photoresist layer 50 contacts some of first light shielding layer 34 within circuitry pattern s area 40 during the etching. Also as shown, such etching is preferably conducted to expose at least some transparent substrate material 32 within circuitry pattern area 40.

Further in accordance with another preferred implementation, but not dependent on that immediately described above, such provides an example of etching first light shielding layer 34 within circuitry pattern area 40 without using second light shielding layer material 36 as a mask within circuitry pattern area 40 during such etching. Again, this is contrary to the prior art processing described above with reference to FIG. 6.

Figure 12:
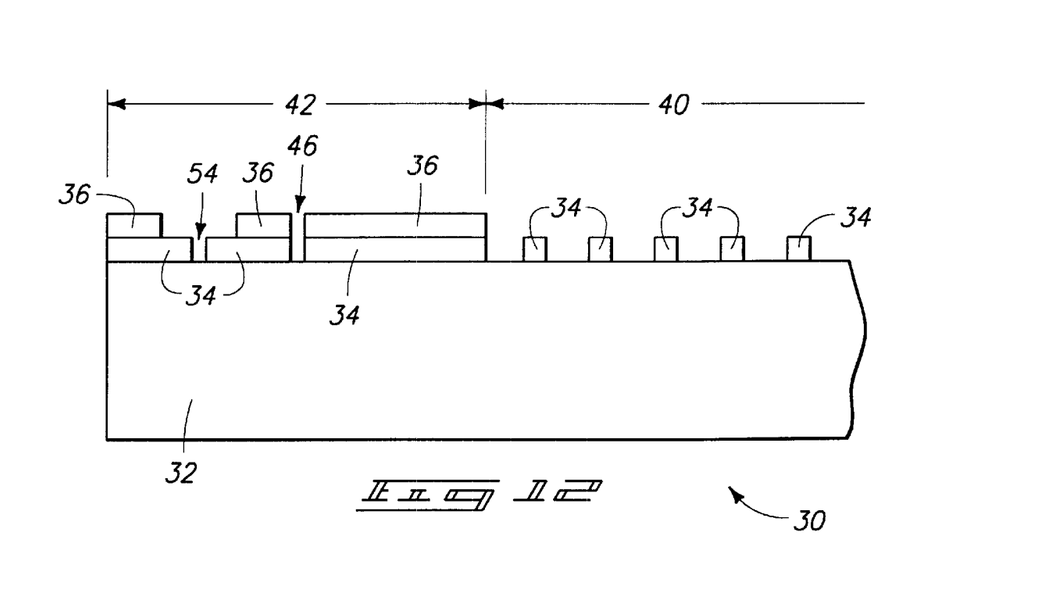
FIG. 12 is a view of the FIG. 9 substrate at a processing step subsequent to that depicted by FIG. 11.

Referring to FIG. 12, photoresist layer 50 (not shown) has been stripped from the wafer, leaving the illustrated construction. Alignment marks 54 in no-circuitry or frame area 42 in the preferred embodiment have been patterned simultaneously with the circuitry fabrication for alignment registration therewith. Such combi or alignment marks are further measured and referenced relative to alignment markings 46 thereadjacent for purposes of achieving suitable alignment of phase shift mask 30 relative to other substrates processed therewith.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of fabricating an attenuated phase shift mask having a circuitry pattern area and a no-circuitry area, the method comprising:

providing a transparent substrate;

forming a first light shielding layer over the transparent substrate, the first light shielding layer comprising an attenuating semi-transparent shifter material;

forming a second light shielding layer over the first light shielding layer;

removing at least some of the second light shielding layer material from the circuitry pattern area prior to forming any circuitry pattern in a photoresist layer in the circuitry pattern area; and after the removing, forming a circuitry pattern in a photoresist layer in the circuitry pattern area.

2. The method of claim 1 wherein the no-circuitry area comprises a frame area which at least partially surrounds the circuitry pattern area.

3. The method of claim 2 wherein the no-circuitry area comprises a frame area which completely surrounds the circuitry pattern area.

4. The method of claim 1 wherein the second light shielding layer is effectively opaque to light transmission.

5. The method of claim 1 wherein the second light shielding layer is not opaque to light transmission.

6. The method of claim 1 wherein the second light shielding layer is comprised of two or more layers.

7. The method of claim 1 wherein the semi-transparent shifter material comprises a metal silicon oxide material, the second light shielding layer comprises a chromium containing material, and wherein the removing comprises wet etching.

8. The method of claim 1 wherein the second light shielding layer is comprised of two or more layers, and the removing removes at least some of each of such two or more layers.

9. The method of claim 1 wherein the second light shielding layer is comprised of two or more layers, the removing removes at least some of each of such two or more layers, and the removing exposes at least some first light shielding layer material within the circuitry pattern area.

10. The method of claim 1 wherein the removing does not expose any transparent substrate material within the circuitry pattern area.

11. The method of claim 1 wherein the removing exposes at least some first light shielding layer material within the circuitry pattern area.

12. A method of fabricating an attenuated phase shift mask having a circuitry pattern area and a no-circuitry area, the method comprising:

providing a transparent substrate;

forming a first light shielding layer over the transparent substrate, the first light shielding layer comprising an attenuating semi-transparent shifter material;

forming a second light shielding layer over the first light shielding layer;

removing all of the second light shielding layer material from the circuitry pattern area prior to forming any circuitry pattern in a photoresist layer in the circuitry pattern area; and after the removing, forming a circuitry pattern in a photoresist layer in the circuitry pattern area.

13. The method of claim 12, wherein the no-circuitry area comprises a frame area which at least partially surrounds the circuitry pattern area.

14. The method of claim 12 wherein the second light shielding layer is effectively opaque to light transmission.

15. The method of claim 12 wherein the second light shielding layer is not opaque to light transmission.

16. The method of claim 12, wherein the removing does not expose any transparent substrate material within the circuitry pattern area.

17. A method of fabricating an attenuated phase shift mask having a circuitry pattern area and a no-circuitry area, the method comprising:

providing a transparent substrate;

forming a first light shielding layer over the transparent substrate, the first light shielding layer comprising an attenuating semi-transparent shifter material;

forming a second light shielding layer over the first light shielding layer;

removing at least some second light shielding material from the entirety of the circuitry pattern area prior to forming any circuitry pattern in the first light shielding layer in the circuitry pattern area; and after the removing, forming a circuitry pattern in a photoresist layer in the circuitry pattern area.

18. The method of claim 17, wherein the second light shielding layer is comprised of two or more layers.

19. The method of claim 17 comprising removing all of the second light shielding material from the entirety of the circuitry pattern area prior to forming a circuitry pattern in the first light shielding layer in the circuitry pattern area.

20. The method of claim 17, wherein the removing exposes at least some first light shielding layer material within the circuitry pattern area.

21. The method of claim 17 comprising removing all of the second light shielding material from the entirety of the circuitry pattern area prior to forming a circuitry pattern in the first light shielding layer in the circuitry pattern area and thereby outwardly exposing the first light shielding layer within the circuitry pattern area.

22. The method of claim 17 comprising removing at least some second light shielding material from the entirety of the circuitry pattern area prior to forming a circuitry pattern in a photoresist layer in the circuitry pattern area.

23. The method of claim 17 comprising removing all of the second light shielding material from the entirety of the -circuitry pattern area prior to forming a circuitry pattern in a photoresist layer in the circuitry pattern area.

24. The method of claim 17 comprising removing all of the second light shielding material from the entirety of the circuitry pattern area prior to forming a circuitry pattern in a photoresist layer in the circuitry pattern area and thereby outwardly exposing the first light shielding layer within the circuitry pattern area.

25. The method of claim 17 wherein the no-circuitry area comprises a frame area which at least partially surrounds the circuitry pattern area.

26. The method of claim 17 wherein the second light shielding layer is effectively opaque to light transmission.

27. The method of claim 17 wherein the second light shielding layer is not opaque to light transmission.

28. The method of claim 17 wherein the removing does not expose any transparent substrate material within the circuitry pattern area.

29. A method of fabricating an attenuated phase shift mask having a circuitry pattern area and a no-circuitry area, the method comprising:

providing a transparent substrate;

forming a first light shielding layer over the transparent substrate, the first light shielding layer comprising an attenuating semi-transparent shifter material;

forming a second light shielding layer over the first light shielding layer; and etching the first light shielding layer within the circuitry pattern area without any second light shielding layer being received over the first light shielding layer within the circuitry pattern area during said etching.

30. The method of claim 29 wherein the second light shielding layer is comprised of two or more layers.

31. The method of claim 29 wherein the etching is conducted while photoresist is over some of the first light shielding layer within the circuitry pattern area.

32. The method of claim 29 wherein the etching is conducted while photoresist is over and in contact with some of the first light shielding layer within the circuitry pattern area.

33. The method of claim 29 wherein the no-circuitry area comprises a frame area which at least partially surrounds the circuitry pattern area.

34. The method of claim 29 wherein the second light shielding layer is effectively opaque to light transmission.

35. The method of claim 29 wherein the second light shielding layer is not opaque to light transmission.

36. The method of claim 29 wherein the etching exposes at least some transparent substrate material within the circuitry pattern area.

37. A method of fabricating an attenuated phase shift mask having a circuitry pattern area and a no-circuitry area, the method comprising:

providing a transparent substrate;

forming a first light shielding layer over the transparent substrate, the first light shielding layer comprising an attenuating semi-transparent shifter material;

forming a second light shielding layer over the first light shielding layer;

patterning the no-circuitry area differently from the circuitry pattern area; and after patterning the no-circuitry area differently from the circuitry pattern area, forming a desired mask in a photoresist layer having a desired circuit pattern in the circuitry pattern area and a desired alignment marking pattern in the no-circuitry area in the same step.

38. The method of claim 37 wherein the patterning comprises photolithography and etch.

39. The method of claim 37 wherein the second light shielding layer is effectively opaque to light transmission.

40. The method of claim 37 wherein the second light shielding layer is not opaque to light transmission.

41. A method of fabricating an attenuated phase shift mask having a circuitry array area and frame area which at least partially surrounds the circuitry array area, the method comprising:

providing a transparent substrate;

forming a first light shielding layer over the transparent substrate, the first light shielding layer comprising an attenuating semi-transparent shifter material;

forming a second light shielding layer over the first light shielding layer; and removing at least some of the second light shielding layer material from the circuitry array area prior to forming any circuitry pattern in a photoresist layer in the circuitry array area.

42. The method of claim 41 wherein no circuitry pattern is ever formed in the frame area.

43. A method of fabricating an attenuated phase shift mask having a circuitry array area and frame area which at least partially surrounds the circuitry array area, the method comprising:

providing a transparent substrate;

forming a first light shielding layer over the transparent substrate, the first light shielding layer comprising an attenuating semi-transparent shifter material;

forming a second light shielding layer over the first light shielding layer; and removing all of the second light shielding layer material from the circuitry array area prior to forming any circuitry pattern in a photoresist layer in the circuitry array area.

44. The method of claim 43 wherein no circuitry pattern is ever formed in the frame area.

45. A method of fabricating an attenuated phase shift mask having a circuitry array area and frame area which at least partially surrounds the circuitry array area, the method comprising:

providing a transparent substrate;

forming a first light shielding layer over the transparent substrate, the first light shielding layer comprising an attenuating semi-transparent shifter material;

forming a second light shielding layer over the first light shielding layer; and removing at least some second light shielding material from the entirety of the circuitry array area prior to forming any circuitry pattern in the first light shielding layer in the circuitry array area.

46. The method of claim 45 wherein no circuitry pattern is ever formed in the frame area.

47. The method of claim 45 comprising removing all of the second light shielding material from the entirety of the circuitry array area prior to forming a circuitry pattern in the first light shielding layer in the circuitry array area.

48. The method of claim 45 comprising removing all of the second light shielding material from the entirety of the circuitry array area prior to forming a circuitry pattern in the first light shielding layer in the circuitry array area and thereby outwardly exposing the first light shielding layer within the circuitry array area.

49. The method of claim 45 comprising removing at least some second light shielding material from the entirety of the circuitry array area prior to forming a circuitry pattern in a photoresist layer in the circuitry array area.

50. The method of claim 45 comprising removing all of the second light shielding material from the entirety of the circuitry array area prior to forming a circuitry pattern in a photoresist layer in the circuitry array area.

51. The method of claim 45 comprising removing all of the second light shielding material from the entirety of the circuitry array area prior to forming a circuitry pattern in a photoresist layer in the circuitry array area and thereby outwardly exposing the first light shielding layer within the circuitry array area.

52. A method of fabricating an attenuated phase shift mask having a circuitry array area and frame area which at least partially surrounds the circuitry array area, the method comprising:

providing a transparent substrate;

forming a first light shielding layer over the transparent substrate, the first light shielding layer comprising an attenuating semi-transparent shifter material;

forming a second light shielding layer over the first light shielding layer; and etching the first light shielding layer within the circuitry array area without any second light shielding layer being received over the first light shielding layer Within the circuitry array area during said etching.

53. The method of claim 52 wherein no circuitry pattern is ever formed in the frame area.

54. A method of fabricating an attenuated phase shift mask having a circuitry array area and frame area which at least partially surrounds the circuitry array area, the method comprising:

providing a transparent substrate;

forming a first light shielding layer over the transparent substrate, the first light shielding layer comprising an attenuating semi-transparent shifter material;

forming a second light shielding layer over the first light shielding layer;

patterning the frame area differently from the circuitry array area;

after patterning the frame area differently from the circuitry array area, forming a desired mask in a photoresist layer having a desired circuit pattern in the circuitry array area and a desired alignment marking pattern in the frame area in the same step.

55. The method of claim 54 wherein no circuitry pattern is ever formed in the frame area.

* * * * *

UNITED STATES PATENT AND TRADEMARK OFFICE
CERTIFICATE OF CORRECTION

PATENT NO.     : 6,440,613 B1                                          Page 1 of 1
DATED          : August 27, 2002
INVENTOR(S)    : Trung Tri Doan It is certified that error appears in the above-identified patent and that said Letters Patent is hereby corrected as shown below:

Column 1,
Line 47, please replace "corresponding is decrease in" with -- corresponding decrease in --

Column 4,
Line 9, please replace "transparent shifter BY material," with -- transparent shifter material, --

Column 5,
Line 27, please replace "and is photoresist layer" with -- and photoresist layer --
Line 40, please replace "circuitry pattern s area" with -- circuitry pattern area --

Column 7,
Line 50, please replace "-circuitry pattern" with -- circuitry pattern --

Signed and Sealed this

Twenty-fifth Day of March, 2003

JAMES E. ROGAN
*Director of the United States Patent and Trademark Office*